（12）United States Patent
Yanagawa et al.

(10) Patent No.: US 6,472,730 B1
(45) Date of Patent: Oct. 29, 2002

(54) SEMICONDUCTOR DEVICE AND METHOD OF MANUFACTURING THE SAME

(75) Inventors: Eiji Yanagawa, Tenri (JP); Akihiko Nakano, Nara (JP); Toshinori Ohmi, Kitakatsuragi-gun (JP); Tadao Takeda, Ebina (JP); Hideyuki Unno, Ebina (JP); Hiroshi Ban, Machida (JP)

(73) Assignees: Sharp Kabushiki Kaisha, Osaka (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/551,741

(22) Filed: Apr. 18, 2000

(30) Foreign Application Priority Data

Apr. 23, 1999 (JP) ............................. 11-117108

(51) Int. Cl.7 ............................................. H01L 23/495
(52) U.S. Cl. .................... 257/676; 257/254; 257/255; 257/415; 257/417; 257/418
(58) Field of Search ................... 257/676, 254, 257/255, 415, 417, 418

(56) References Cited

U.S. PATENT DOCUMENTS

| 4,947,309 A | * | 8/1990 | Jonsson ........................ 363/17 |
| 5,031,821 A | * | 7/1991 | Kaneda et al. ............ 228/110.1 |
| 5,708,572 A | * | 1/1998 | Bergk ........................ 363/21.12 |
| 5,726,371 A | * | 3/1998 | Shiba et al. .................... 84/603 |
| 6,214,684 B1 | * | 4/2001 | Shoji ............................ 438/308 |

FOREIGN PATENT DOCUMENTS

| EP | 0509567 | | 10/1992 |
| EP | 0510434 | | 10/1992 |
| EP | 0860882 | | 8/1998 |
| JP | 60000747 A | * | 1/1985 |
| JP | 63237144 | | 10/1988 |
| JP | 01015957 | | 1/1989 |
| JP | 01015957 A | * | 1/1989 |
| JP | 5211262 | | 8/1993 |
| JP | 11345823 A | * | 12/1999 |
| WO | 9736326 | | 10/1997 |

* cited by examiner

Primary Examiner—Eddie Lee
Assistant Examiner—Chris C Chu

(57) ABSTRACT

A semiconductor device in accordance with the present invention includes a semiconductor element chip pressed and secured on a distortion die-pad so that the semiconductor element chip, sealed inside a package, is held in a predetermined distorted state. The predetermined distorted state is preferably downward or upward warping. The semiconductor element chip operates normally in the distorted state, and does not operate normally when the semiconductor element chip is separated from the semiconductor device, and thereby released from the distortion and laid alone. This ensures that the semiconductor element chip is protected from circuit analysis.

16 Claims, 14 Drawing Sheets

FIG. 8
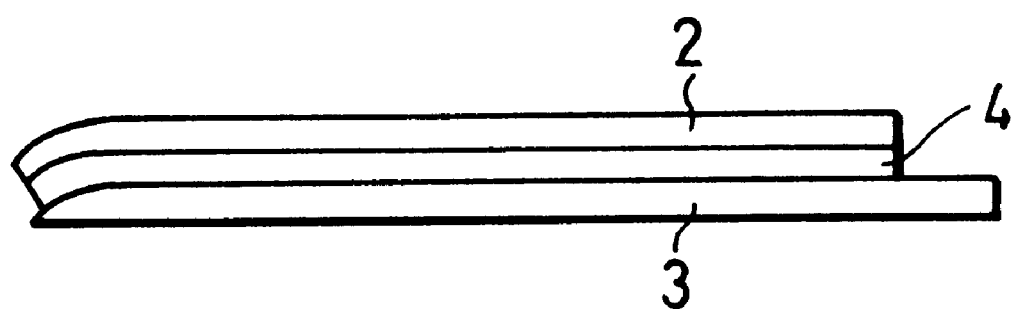
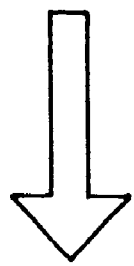
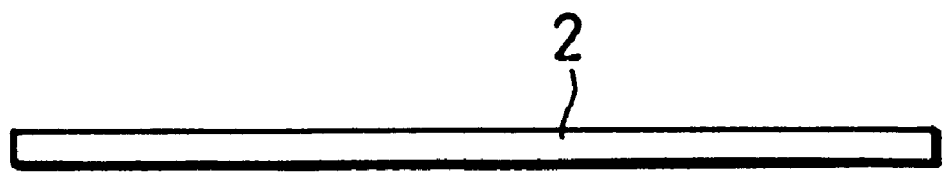

FIG. 14
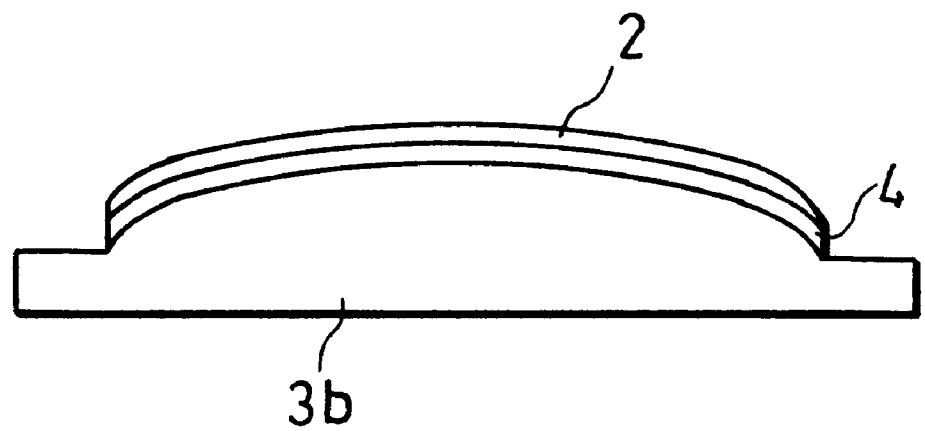
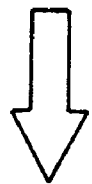

US 6,472,730 B1

SEMICONDUCTOR DEVICE AND METHOD OF MANUFACTURING THE SAME

FIELD OF THE INVENTION

The present invention relates to a semiconductor device capable of protecting a semiconductor element from circuit analysis, by the use of electrical properties of transistors which change as a result of warping or otherwise distorting the semiconductor element, and also to a method of manufacturing such a semiconductor device.

BACKGROUND OF THE INVENTION

Conventionally, a semiconductor element chip (hereinafter, will be simply referred to as "a chip") containing transistors, as well as circuitry including an IC (Integrated Circuit) or an LSI (Large Scale Integration) circuit, is sealed in, for example, a plastic package before actual used as a semiconductor device. The sealing is provided in view of protection from environment and so as to enable easy handling of the semiconductor element chip.

FIG. 16 shows such an example of a package-type semiconductor device 101 in which a chip 102 containing an LSI circuit as part of its circuitry is sealed in an epoxy resin package 108. The chip 102 is secured firmly on a die-pad 103 by silver paste 104, and provided with pads 105 where the chip 102 is connected via gold wire bonds 106 to lead wires 107 which are in turn connected to components external to the package 108.

A typical package-type semiconductor device is manufactured in the following manner. First, the securing surface of the die-pad 103 is coated with the silver paste 104 on which the chip 102 is placed, and the whole piece is pressed while being heated at 160° C. to 170° C., so that the silver paste 104 solidifies with heat, thereby securing the chip 102 onto the die-pad 103. Thereafter, the pads 105 of the chip 102 are coupled to the lead wires 107 by the gold wire bonds 106. The manufacturing process completes as a package 108 is formed by sealing the chip 102 in epoxy resin.

Currently, in most cases, the chip 102 is at least 200 $\mu$m thick, and is normally secured on the die-pad 103 in a flat state so as to prevent deterioration of its properties.

Japanese Laid-Open Patent Application No. 5-211262/1993 (Tokukaihei 5-211262; published on Aug. 20, 1993) discloses a technology (will be referred to as technology 1) used for a resin seal-type semiconductor device, which is a package-type semiconductor device of the foregoing kind. According to the technology, a heat spreader is provided under a pellet support (corresponds to the die-pad 103) on which a semiconductor pellet (corresponds to the chip 102) is mounted, thereby reducing thermal resistance and allowing high power-consuming products to be offered in plastic packages. Further, the technology enables the resin to have a uniform thickness, thereby reducing the likelihood of cracks and warps developing in the package. The technology successfully gives products improved reliability.

Further referring to a package-type semiconductor device of the foregoing kind, Japanese Laid-Open Patent Application No. 64-15957/1989 (Tokukaisho 64-15957; published on Jan. 19, 1989) discloses a technology (will be referred to as technology 2) used for a package in which pressure is exerted to the chip 102. According to the technology, gas or liquid is sealed in a semiconductor package together with an NMOS semiconductor element chip (corresponds to the chip 102), so as to exert mechanical pressure (stress) to the chip, thereby increasing current and improving the performance of the semiconductor element.

In reference to technology 2 above, although not related to semiconductor elements, Japanese Laid-Open Patent Application No. 5-93659/1993 (Tokukaihei 5-93659; published on Apr. 16, 1993) and other documents disclose a sensor that works based on the stress exerted to various kinds of resistor elements. The sensor works based on the electric resistance of a glass layer which changes with distortion.

Incidentally, the package-type semiconductor device 101 leaves the integrated circuit contained in the chip 102 sealed in the semiconductor device 101 relatively susceptible to analysis. To perform analysis on the chip 102, the package 108 is first unsealed to allow observation of the chip 102. Normally, the chip 102 is coated with a polyimide film (not shown) having a thickness of 50 $\mu$m to 100 $\mu$m to prevent malfunction caused by $\alpha$ rays. Further, when the chip 102 is sealed, the package 108 is formed by covering the chip 102 with epoxy resin or other materials as mentioned in the foregoing. Therefore, simply unsealing the package 108 is not enough to observe the chip 102 through microscope, let alone to analyse the integrated circuit.

However, the polyimide film and epoxy resin can be removed using an etchant containing oleum and sulfuric acid as its components. Once the resin and other coverings are removed using etchant, the chip 102 itself is susceptible to any kind of analysis from external observation to circuit analysis whereby properties can be measured through a probe directly in contact with the chip 102.

Further, the packaged chip 102 is 200 $\mu$m thick or thicker; therefore, the packaged chip 102 is sealed in a flat state in the package 108, and even after the coverings are removed for analysis, the chip 102 still retains the flat state, allowing the integrated circuit contained in the chip 102 to operate normally with the same properties as when it is packaged.

In short, the structure and packaging method of the conventional semiconductor device 101 do not go far enough to prevent performing analysis on the integrated circuit contained in the chip 102 from which the resin is removed and is laid alone, failing to offer protection to secret information.

Technology 1, although having successfully improved the reliability and performance of semiconductor devices, does not pay attention at all to the prevention of analysis of the chip 102. Similarly, technology 2, although pressure is applied to the chip 102 in the package, does not pay attention at all to the prevention of analysis of the chip 102, rendering the chip 102 readily available for analysis once the chip 102 is separated from all the other components and laid alone. Further, the documents related to distortion sensors deal with a different technical field, and do not disclose nor suggest the prevention of analysis.

SUMMARY OF THE INVENTION

In view of the foregoing problem, the present invention has an object to offer a package-type semiconductor device capable of providing a high level of protection from circuit analysis to an integrated circuit contained in a semiconductor element chip sealed in a package, and also a method of manufacturing such a semiconductor device.

In order to solve the foregoing problems, the semiconductor device in accordance with the present invention includes: a semiconductor element with an integrated circuit; and a package for sealing the semiconductor element therein, so as to be connected to an external circuit for use, wherein the semiconductor element is secured in the package in a predetermined distorted state, and the semiconductor element operates normally only in the distorted state.

With the arrangement, the semiconductor element operates normally only in the predetermined distorted state; therefore, once the semiconductor element is separated from the semiconductor device and thereby released from the distorted state, the semiconductor element dose not operate normally. This ensures that the semiconductor element is protected from circuit analysis, and thereby ensures that the secret information of the semiconductor element is protected.

The method of manufacturing a semiconductor device in accordance with the preset invention, in order to solve the foregoing problems, is such that in the step of sealing a semiconductor element with an integrated circuit in a package, a semiconductor element that operates normally only in a predetermined distorted state is secured and thereafter sealed in the package in the distorted state.

According to the method, a semiconductor element that operates normally only in a predetermined distorted state is secured and sealed in the distorted state. This enables manufacture of a semiconductor device that ensures that the semiconductor element is protected from circuit analysis.

For a fuller understanding of the nature and advantages of the invention, reference should be made to the ensuing detailed description taken in conjunction with the accompanying drawings.

BRIEF DESCRIPTION OF THE DRAWINGS

FIG. 8 is an explanatory drawing showing a semiconductor element chip separated from the semiconductor device shown in FIG. 1.

FIG. 14 is an explanatory drawing showing a semiconductor element chip separated from the semiconductor device shown in FIG. 12.

DESCRIPTION OF THE EMBODIMENTS

[Embodiment 1]

Referring to FIG. 1 to FIG. 11, the following description will discuss an embodiment of the present invention, but dose not constitute a limitation to the scope of the present invention in any manner.

The semiconductor device in accordance with the present invention includes a semiconductor element secured in a package in a predetermined distorted state. The semiconductor element operates normally only in this distorted state. In this structure, if the semiconductor element is separated from the rest of the semiconductor device, the semiconductor element is released and returns to a normal state. This prevents the semiconductor element from operating normally, and thereby ensures the protection of the semiconductor element from circuit analysis.

The semiconductor element includes transistors provided in the form of a tightly packed transistor. In the present embodiment, the operation of the transistor section depends on changes in electrical properties of transistors with distortion of the transistor section: the transistor section operates normally when it is in the distorted state and fails to do so when it is not.

Figure 1:
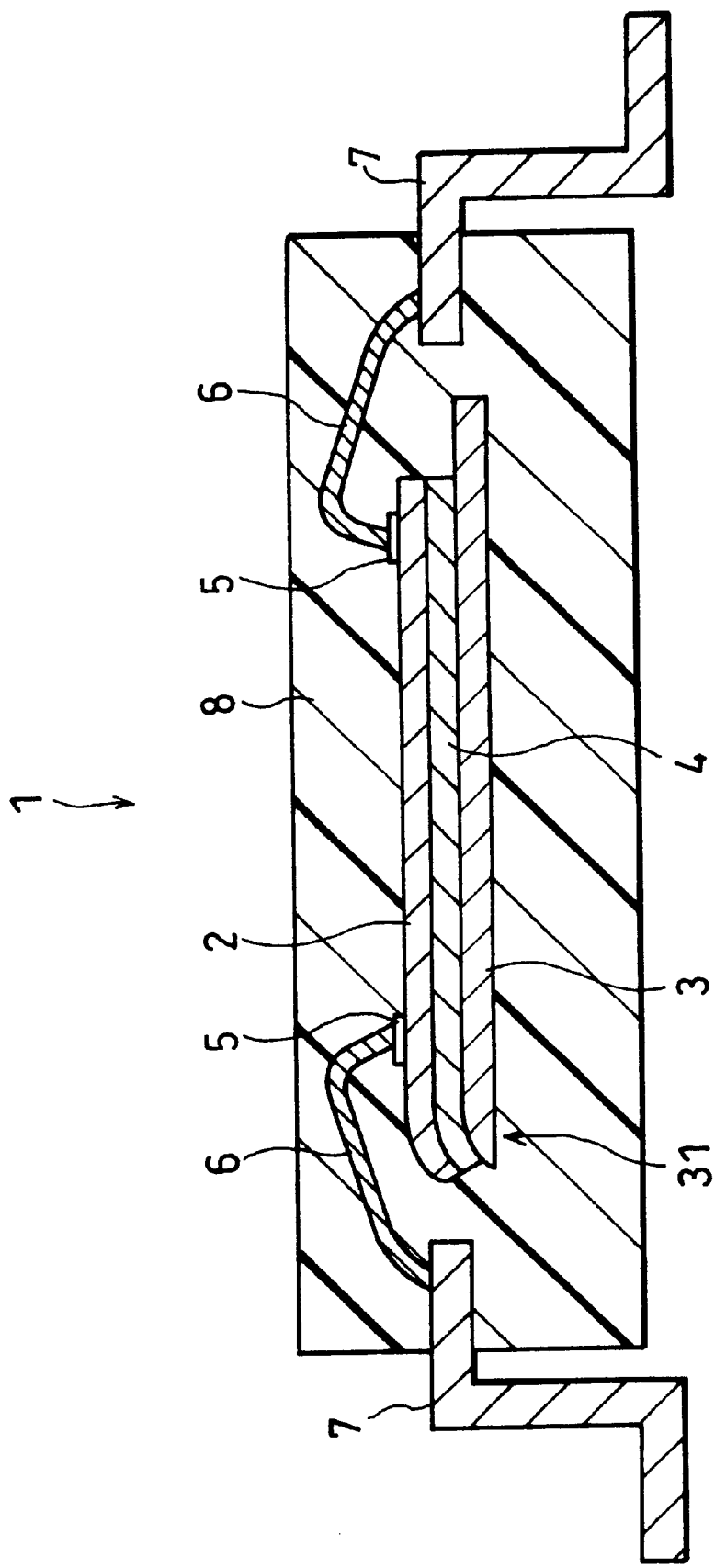
FIG. 1 is a schematic cross-sectional view showing an arrangement of a semiconductor device of an embodiment in accordance with the present invention.

As shown in FIG. 1, the semiconductor device 1 of the present embodiment includes a semiconductor element chip 2 (hereinafter, will be simply referred to as "a chip") sealed inside the package 8. The chip 2 is pressed and secured via a silver paste 4 onto a distortion die-pad 3 providing support to secure the chip 2, and connected via pads 5 and gold wire bonds 6 to lead wires 7 coupling the chip 2 to external circuits.

Figure 2:
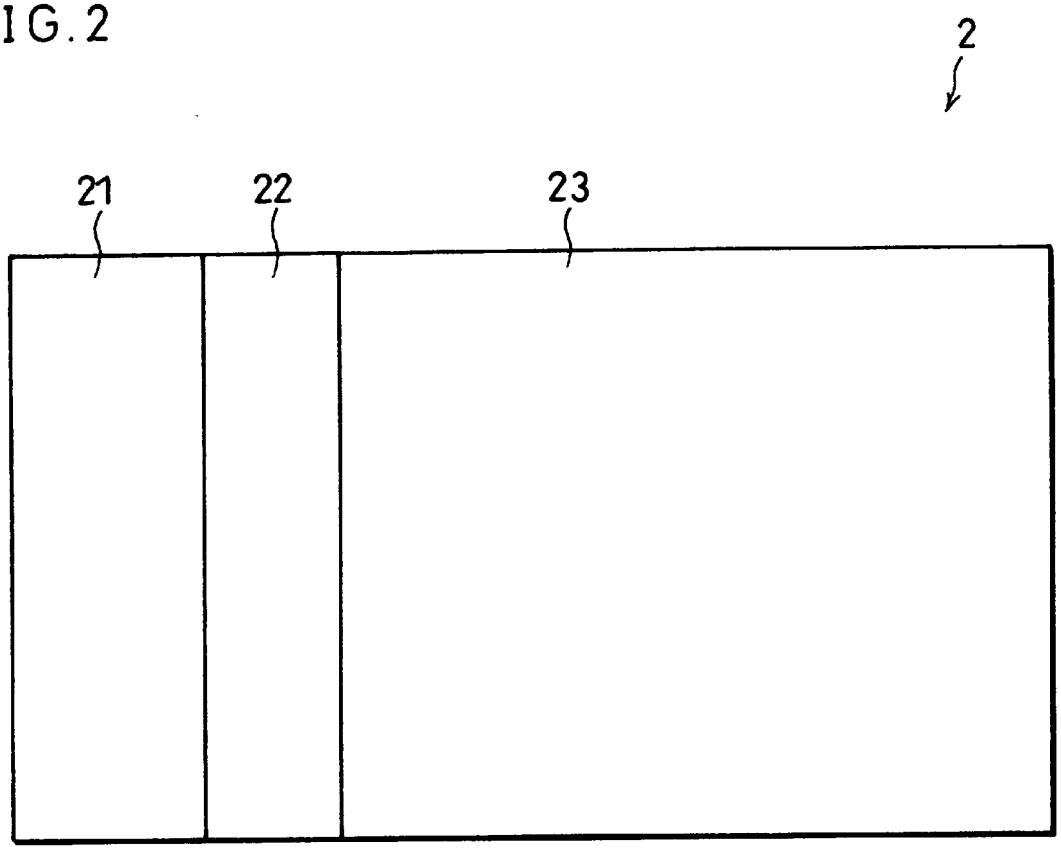
FIG. 2 is a schematic plan view showing an arrangement of a semiconductor element chip used in the semiconductor device shown in FIG. 1.

The chip 2, as shown in FIG. 2, is constituted by a transistor section 21 where transistors are provided in a high density, a sensor section 22 where detection means is disposed for detecting changes in electrical properties of the transistors, and an LSI (Large Scale Integration) section 23 where an LSI circuit and other components are disposed. The transistors in the transistor section 21 are not limited in any particular manner; examples include NMOS-type transistors. As with the transistors, the LSI circuit is not limited in any particular manner either. The detection means will be explained in detail later.

The chip 2 is constructed so that at least the transistor section 21 can be placed in the predetermined distorted state. In the present embodiment, the transistor section 21 is warped as an example of the predetermined distorted state. The warping is particularly preferred because it is relatively easy to achieve compared to other kinds of distortion and hardly lost even if the transistor section 2 is secured on the distortion die-pad 3, and dose not negatively affect the chip 2.

Figure 3:
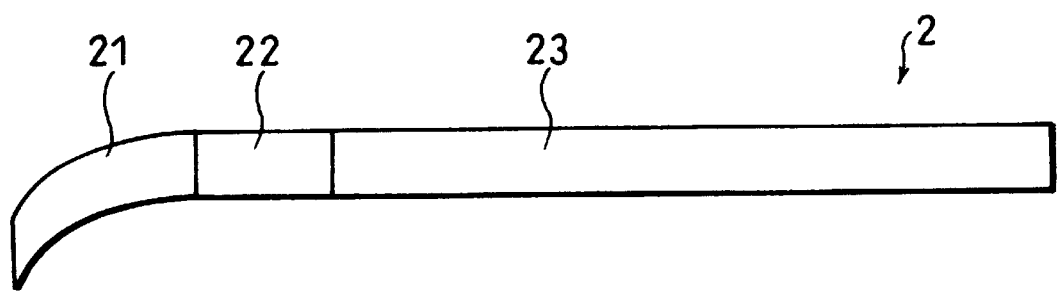
FIG. 3 is a schematic side view showing a warped state of the semiconductor element chip shown in FIG. 2.

In the present embodiment, the whole chip 2 is reduced in thickness so as to allow at least the transistor section 21 in the chip 2 to be distorted (to be specific, warped, in the present embodiment) in the predetermined manner as shown in FIG. 3. In other words, reducing the thickness of the chip 2 enables the chip 2 to be distorted from the flat state to the warped state.

The reduction of the thickness of the chip 2 is not limited in any particular manner, supposing that the reduced thickness readily allows the chip 2 to be placed in the predetermined warped state, and does not negatively affect the function of the transistors and LSI circuit contained in the chip 2. In the present invention, a chip 2 having a thickness of about 200 μm or larger when used conventionally is preferably reduced to 50 μm or even further in thickness, and more preferably to a value between 50 μm and 30 μm. The thickness of the chip 2, when thus reduced, surely enables the chip 2 to be warped in the predetermined manner, and does not negatively affect the function of the chip 2.

Thickness may be reduced across the whole chip 2 or only partially, for example, in the transistor section 21; there is no particular limitation in any manner. In the present embodiment, thickness is reduced at least in the transistor section 21 so that the transistor section 21 can be warped to allow the detection means to detect changes in electrical properties of the transistors in the distorted state.

Figure 4:
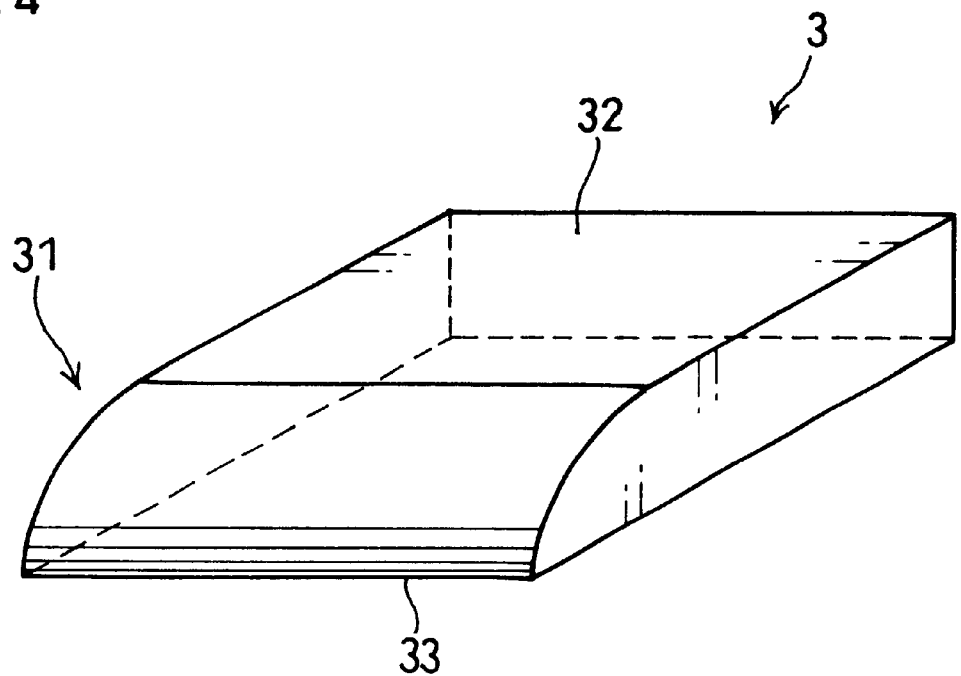
FIG. 4 is a schematic perspective view showing an example of the shape of a distort die-pad on which the semiconductor element chip shown in FIG. 1 is secured and held in a warped state.
Figure 5:
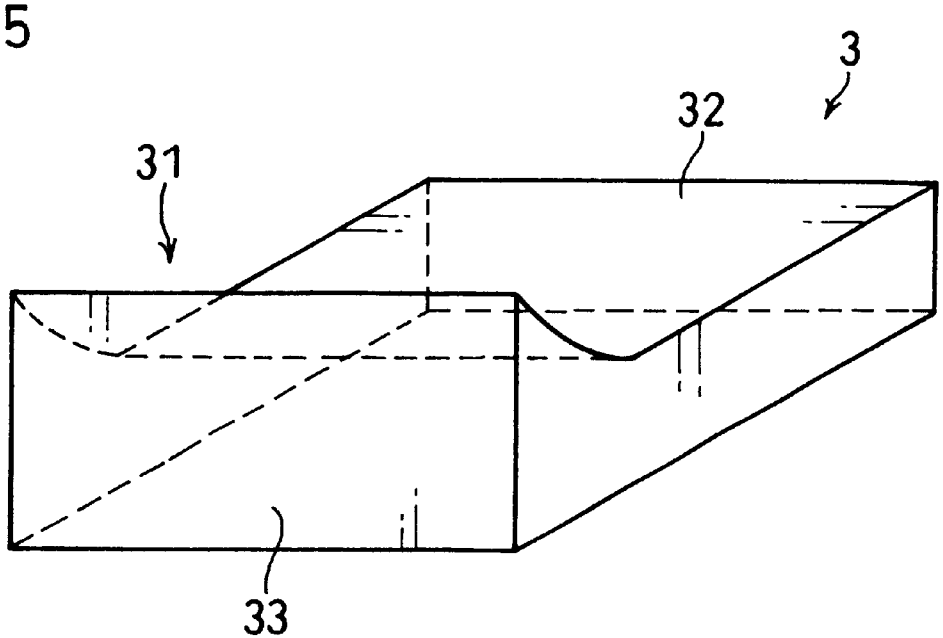
FIG. 5 is a schematic perspective view showing another example of the shape of the distort die-pad shown in FIG. 4.

The distortion die-pad 3 is, overall, shaped like a flat panel similarly to those die-pads used in conventional semiconductor devices, but with a distortion part 31 to place the chip 2 in the predetermined distorted state when the chip 2 is secured thereto, either as shown in FIG. 4 or as shown in FIG. 5. In other words, the distortion die-pad 3 of the present invention differs from conventional die-pads in that the former has a shape corresponding to a desired distorted shape of the chip 2.

The specific structure of the distortion part 31 is not limited in any particular manner, supposing that the distortion part 31 is able to place the chip 2 in the predetermined distorted state when the chip 2 is actually secured onto a securing surface 32 of the distortion die-pad 3 where the chip 2 is to be secured. In the present embodiment, the securing surface 32 is warped in the distortion part 31 so as to warp the chip 2.

FIG. 4 shows a downward warping surface, as an example of the warping structure of the distortion part 31, constituting a part of the securing surface 32, where the distortion die-pad 3 becomes thinner toward its edge 33. The warping surface may substantially resemble that of a column laid along the edge 33, and alternatively, may be a gently curved surface, not necessarily a complete column surface.

As another example of the warped structure, FIG. 5 shows an upward warping surface that is effectively reverse to the above example, where the distortion die-pad 3 becomes thicker toward its edge 33 that is elevated from the securing surface 32. In short, in the present embodiment, the distortion part 31 of the distortion die-pad 3 only needs to have an either downward or upward warping surface constituting a part of the securing surface 32.

The chip 2 is pressed and secured onto the securing surface 32 of the distortion die-pad 3 by the silver paste 4 as an adhesive agent. The silver paste 4 may be any conventional silver paste. Reduced in thickness as in the foregoing, the chip 2 warps in accordance with the shape of the distortion die-pad 3 as the chip 2 is pressed and secured onto the distortion die-pad 3 by the silver paste 4.

Figure 6:
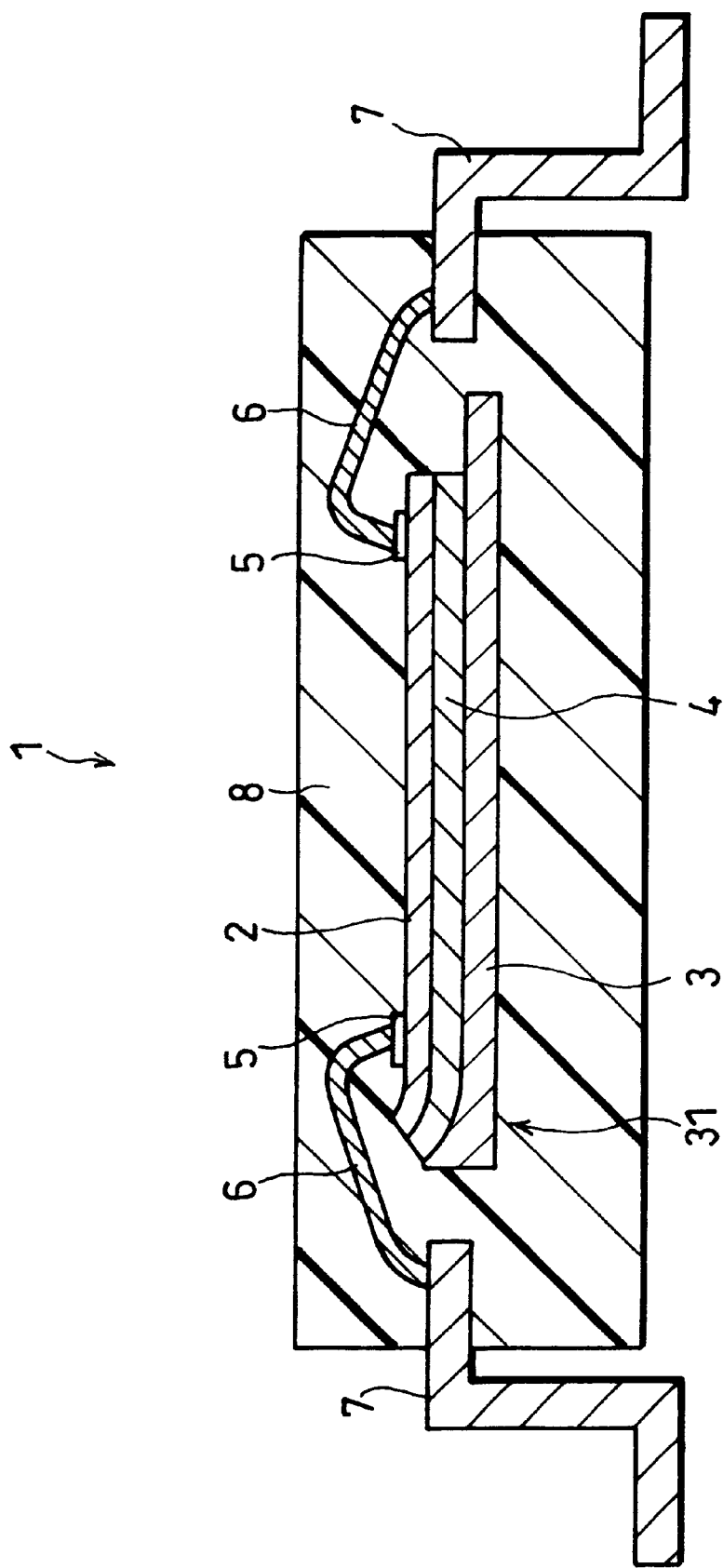
FIG. 6 is a schematic cross-sectional view showing another example of the semiconductor device shown FIG. 1.

Specifically, when the distortion die-pad 3 has a downward warping surface constituting a part of the securing surface 32 (see FIG. 4), the chip 2 warps down toward the edge 33 as shown in FIG. 1. Meanwhile, when the distortion die-pad 3 has an upward warping surface constituting the securing surface 32 (see FIG. 5), the chip 2 warps up toward the edge 33 as shown in FIG. 6. The structure of the semiconductor device 1 shown in FIG. 6 is identical to that of the semiconductor device 1 shown in FIG. 1, except that the chip 2 is warped, and therefore a thorough description thereof is omitted here.

As shown in FIG. 1 and FIG. 6, the chip 2 is connected to the lead wires 7 by the gold wire bonds 6. Specifically, the pad 5 provided to the chip 2 is coupled to an end of the gold wire bond 6 of which the other end is coupled to an end of the lead wire 7. The other end of the lead wire 7 sticks out from the package 8, and serves to connect the semiconductor device 1 in accordance with the present invention to an external circuit.

The package 8 in which the chip 2 is sealed is suitably a plastic package used in a conventional semiconductor device and preferably made of an epoxy resin; however, this is not the only possible material available for the plastic package.

As mentioned in the foregoing, the chip 2 includes the transistor section 21, the sensor section 22, and the LSI section 23 (see FIG. 2). The sensor section 22 is provided at least between the transistor section 21 and the LSI section 23. This is because the detection means disposed in the sensor section 22 connects the transistors to the LSI circuit (a detailed description will follow). The detection means has a function to detect properties, of the transistors, produced when the transistor section 21 is in the warped state, and to thereby control the operation of the LSI circuit in the LSI section 23.

The following will explain changes in properties of the transistors that occur when the transistor section 21 warps. For example, suppose that each of the transistors is of an NMOS type, and a stress is applied to the transistor section 21 so that the transistor section 21 warps downward in parallel or perpendicular to the current flow (see FIG. 1 or FIG. 3). Under the situation, channel current increases by 10% if the transistor section 21 warps so that r equals 10 mm, where "r" represents the radius of the warp. In the present embodiment, a change in the current value of transistors caused by the warping of the transistor section 21 is detected by the detection means to control LSI circuit operation.

Incidentally, the transistors constituting the transistor section 21 change their properties differently when the transistor section 21 is warped downward on the distortion die-pad 3 shown in FIG. 4 (the securing surface 32 warps downward) and when the transistor section 21 is warped upward on the distortion die-pad 3 shown in FIG. 5 (the securing surface 32 warps upward). These mutually differing warped states are also usable for the control of LSI circuit operation.

Figure 7:
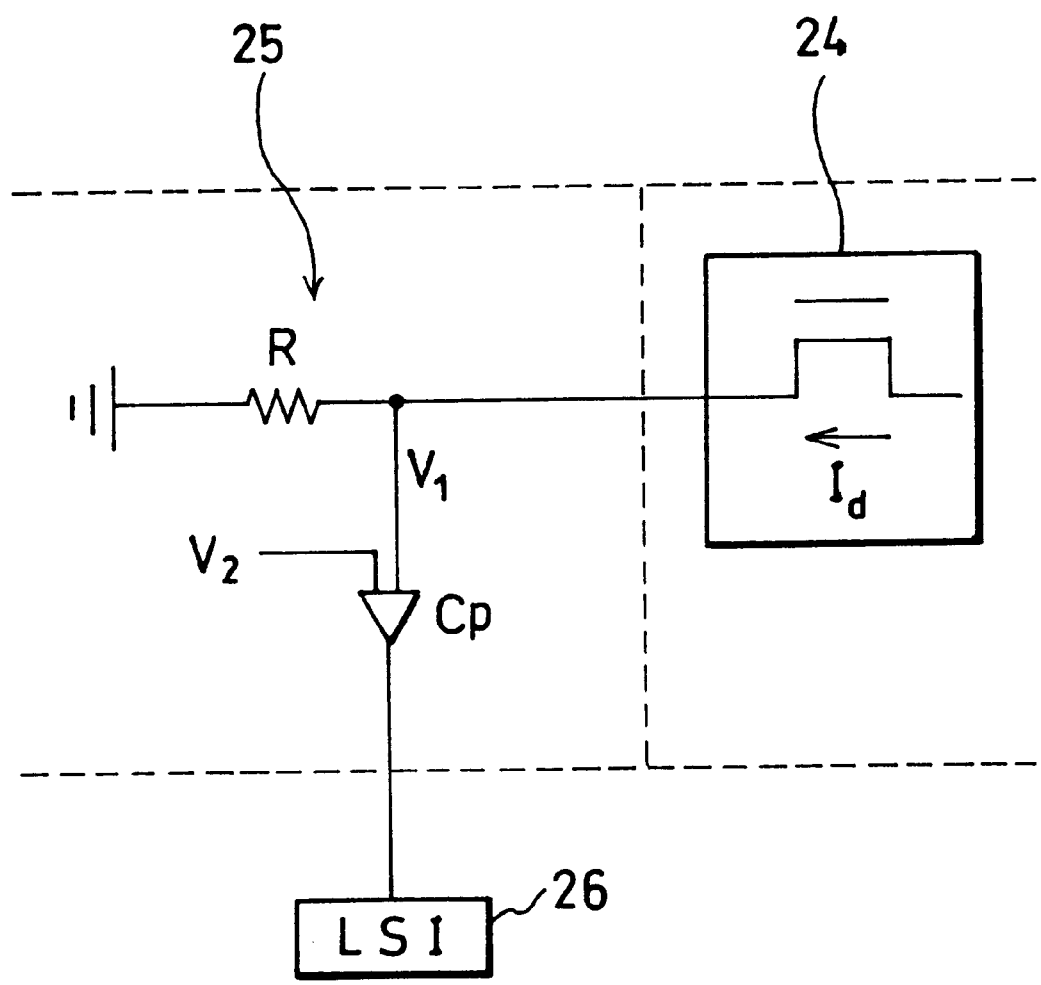
FIG. 7 is a circuit diagram showing an example of an arrangement of a sensor provided to a sensor section of the semiconductor element chip shown in FIG. 2.

The detection means may be an OP-amplifier or other analogue circuits, for example. The OP-amplifier detects changes in properties of the transistor that occur when the flat transistor section 21 is warped. A specific example includes the distortion sensor 25 constituted by a resistor R and a comparator Cp as shown in FIG. 7.

An end of the resistor R is connected to the transistor 24, while the other end is grounded. The comparator Cp has two input terminals and an output terminal. One of the two input terminals is connected to a wire linking the resistor R to the transistor 24, while the other input terminal is provided with a predetermined voltage V2. The output terminal is connected to an LSI circuit 26.

Further, an operation prohibition circuit (not shown) is included for prohibiting operation of the LSI circuit 26 unless the circuit receives a signal from the comparator Cp. The provision of the circuit prevents the LSI circuit 26 from operating independently. The operation prohibition circuit is for prohibiting operation of the LSI circuit 26 even when a probe is performed on the LSI circuit 26 alone for circuit analysis.

The circuit for prohibiting operation of the LSI circuit 26 is not limited in any particular manner, provided that it allows the LSI circuit 26 to operate when the circuit receives a signal from the comparator Cp. A register makes a good example. Alternatively, the distortion sensor 25 and the LSI circuit 26 may be arranged so as receive a power supply and be grounded (see FIG. 7) at shared common pads.

As the transistor 24 receives a drive voltage, a property voltage V1 is produced depending on the relation between the resistor R connected to the transistor 24 and the property current Id produced in the transistor 24. The comparator Cp compares the property voltage V1 coupled to one of the input terminals of the comparator Cp with the predetermined voltage V2 coupled to the other input terminal; if the predetermined voltage V2 is greater than the property voltage V1, the comparator Cp transmits a high signal through its output terminal to the LSI circuit 26; if the predetermined voltage V2 is smaller than the property voltage V1, the comparator cp transmits a low signal through its output terminal to the LSI circuit 26. The high and low signals from the distortion sensor 25 control the operation of the LSI circuit 26.

The following description will explain the control of the operation of the LSI circuit 26. Supposing that the transistor section (NMOS transistors) 21 contained in the chip 2 is warped downward as shown, for example, in FIG. 1 or FIG. 3, as the LSI circuit 26 contained in the distorted chip 2 operates, the drive voltage causes a property current Id to flow through the transistor 24; the property current Id in turn causes a property voltage V1 to grow across the resistor R, which is fed to the comparator Cp. The comparator Cp then compares the incoming property voltage V1 with the predetermined voltage V2.

In the present embodiment, NMOS transistors are used as the transistor 24 and the transistor section 21 is warped downward. If it turns out from a comparison in such an event that the predetermined voltage V2 is smaller than the property voltage V1 (V2<V1), the comparator Cp determines that the transistor 24 has normal properties, and provides a low signal to the LSI circuit 26. The sensor section 22 is set so that the LSI circuit 26 operates normally when the NMOS transistors are warped downward.

Settings of the sensor section 22 will be explained in detail in the following. In the present embodiment, as mentioned in the foregoing, NMOS transistors are used as the transistor 24, and the chip 2 is warped downward and packaged. In such an event, a property current Id starts flowing through the transistor 24, which are NMOS transistors, in response to application of a drive voltage, and a property voltage V1 is fed to the comparator Cp. Here, as to the comparator Cp, the predetermined voltage V2 is set to such a value that the outcome of the comparison of the predetermined voltage V2 and the property voltage V1 is such that the predetermined voltage V2 is smaller than the property voltage V1. Consequently, the comparator Cp determines that V2<V1 as in the foregoing and also that the transistor 24 has normal properties, and transmits a low signal so as to allow the LSI circuit 26 to operate.

Now, suppose that the chip 2 is separated from the distortion die-pad 3 and is laid alone with the resin film and other materials formed on the chip 2 having been removed as shown in FIG. 8. As mentioned in the foregoing, the chip 2 is distorted only when it is secured to the distortion die-pad 3. When the chip 2 is not secured to the distortion die-pad 3, the transistor section 21 no longer warps, and changes into a flat state.

Silicon and other materials constituting the chip 2, if formed in a thickness of 50 $\mu$m or below, are elastic; the chip 2 warps with stress, and returns to a flat state once the stress is removed. In the present invention, the chip 2 is secured by means of that elasticity and sealed in the semiconductor device 1. As a result, if the chip 2 is separated and laid alone, the transistor section 21 is released from the warping and returns to a flat state as explained in the foregoing; thereby, the property current Id flowing through the transistor 24 to which the drive voltage is supplied changes when compared with a warped state.

Suppose that someone tries to conduct a probe on the flat chip 2 separated from the rest of the device for the purpose of circuit analysis. Contrary to his/her expectation, the chip 2 does not operate with the LSI circuit 26 alone; therefore, the transistor 24 must be driven, and a drive voltage is applied accordingly. The property current Id caused by the application of the drive voltage has a decreased value when compared with an upward warped state, causing the property voltage V1 to decrease too. The decreased property voltage V1 is fed to the comparator Cp, and compared with the predetermined voltage V2; the outcome will be such that the predetermined voltage V2 is greater than the property voltage V1 (V2>V1).

In the present embodiment, as mentioned in the foregoing, the comparator Cp determines that the transistor 24 has normal properties and provides a low signal to the LSI circuit 26, if the outcome of the comparison is such that the predetermined voltage V2 is smaller than the property voltage V1 (V2<V1). Therefore, if the outcome is such that the predetermined voltage V2 is greater than the property voltage V1 (V2>V1) as in the foregoing, the comparator Cp determines that the transistor 24 does not have normal properties and provides a high signal to the LSI circuit 26. This prohibits normal operation of the LSI circuit 26, and eventually prevents a probe from being conducted for circuit analysis.

In this manner, when the distortion sensor 25 of the present embodiment detects a, property current Id from the transistor 24 whose value is in a certain range as a change in an electrical of the transistor 24, the distortion sensor 25 transmits, based on the outcome of the detection, a signal that causes the LSI circuit 26 to operate normally. By contrast, when the distortion sensor 25 detects a current from the transistor 24 whose value is outside the foregoing range, that is, outside the range of the property current Id, or when the distortion sensor 25 fails to detect the predetermined property current Id, the distortion sensor 25 transmits a signal that prohibits normal operation of the LSI circuit 26.

The distortion sensor 25 may be arranged so that when it detects a current whose value is outside the range of the property current Id, or fails to detect the predetermined property current Id, it either does not transmit a signal that causes the LSI circuit 26 to operate normally or transmits a signal that prohibits operation of the LSI circuit 26.

Further, the distortion sensor 25 used in the semiconductor device 1 in accordance with the present invention is not limited to the aforementioned analogue circuit: the distortion sensor 25 may be arranged in any manner, provided that it is capable of detecting a change in an electrical property when the transistor section 21 changes from a non-distorted state to a distorted state.

Further, if a part other than the transistor section 21 changes its electrical properties with the distortion of the chip 2, the distortion sensor 25 may be arranged in any manner, provided that it is capable of detecting a change in electrical properties of that part. Hence, any part of the chip 2 other than the transistor section 21 may be distorted in a predetermined manner, and the detection means for detecting a change in electrical properties that occurs in the distorted state is not limited to the distortion sensor 25.

In addition, the transistor section 21, the sensor section 22, and the LSI section 23 may be disposed on the chip 2 in any manner, provided that the sensor section 22 is disposed so as to connect the transistor section 21 to the LSI section 23.

Figure 9:
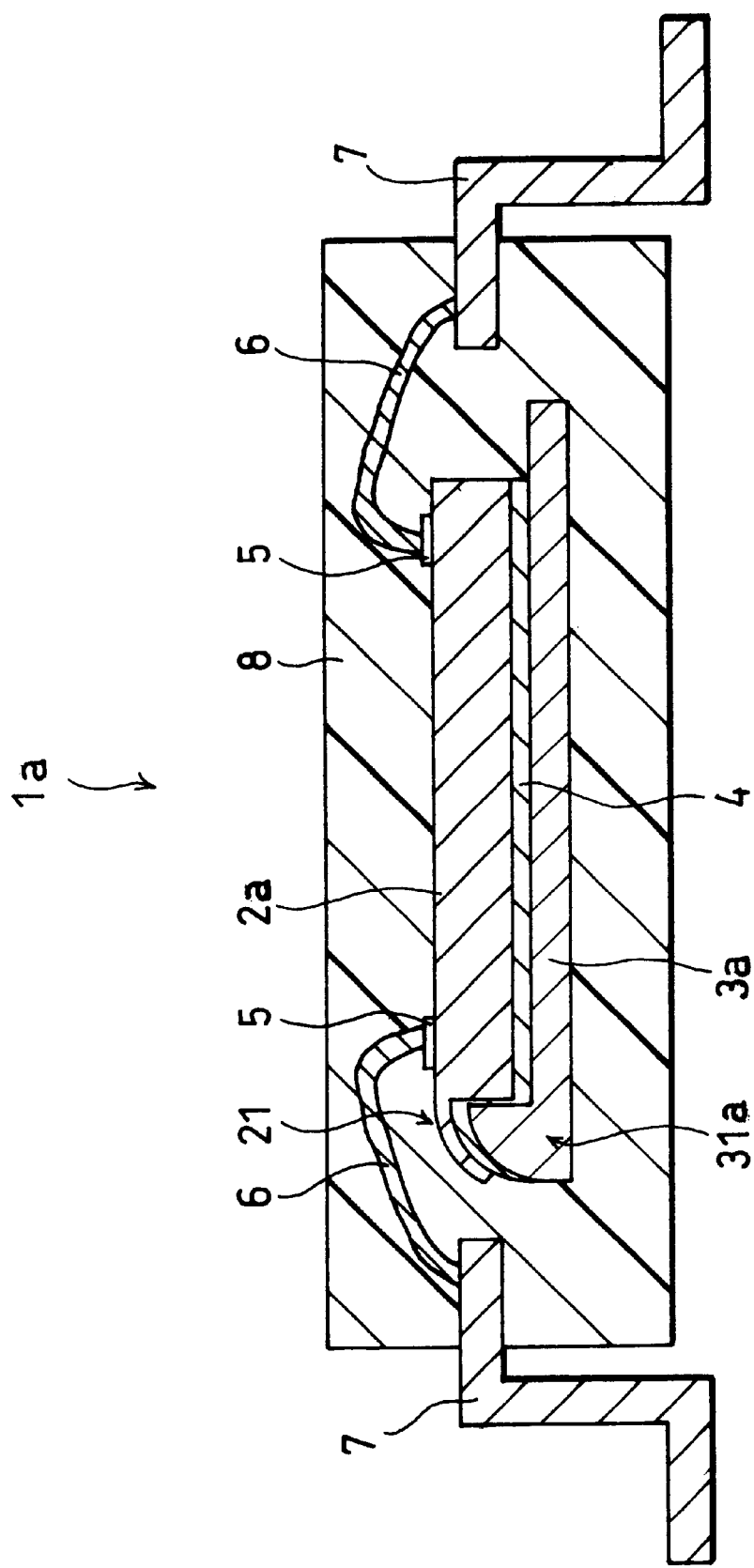
FIG. 9 is a schematic cross-sectional view showing another arrangement of the semiconductor device shown in FIG. 1.

Here, if the entire chip 2 is reduced in thickness, the chip 2 warps easily, but has a reduced strength and renders the semiconductor device 1 difficult to handle. The overall strength can be enhanced if a semiconductor device 1a includes, as shown in FIG. 9, a chip 2a that is reduced in thickness only in the transistor section 21 that is to be warped.

Specifically, only the transistor section 21 (the warped part), which constitutes a part of the chip 2a, is reduced in thickness to 50 µm or below, whereas the other part (the sensor section 22 and the LSI section 23) is not reduced in thickness and remains in a normal thickness of 200 µm or thicker. A distortion die-pad 3a on which the chip 2a is secured includes a distortion part 31a protruding from the securing surface 32 located opposite the transistor section 21 as shown in FIG. 9. So, the distortion part 31a has an increased thickness compared with the other part so as to correspond to the thinned transistor section 21. Meanwhile, in the other part, the securing surface 32 is flat and the thickness is reduced.

By reducing only the distorted part of the chip 2a in thickness in the foregoing manner, the chip 2a loses its strength only in a restrained manner, and the semiconductor device 1a allows for easy handling. Otherwise, the semiconductor device 1a is arranged in the same manner as the semiconductor device 1 shown in FIG. 1 and FIG. 6, and therefore, a through explanation thereof is omitted here.

Figure 10:
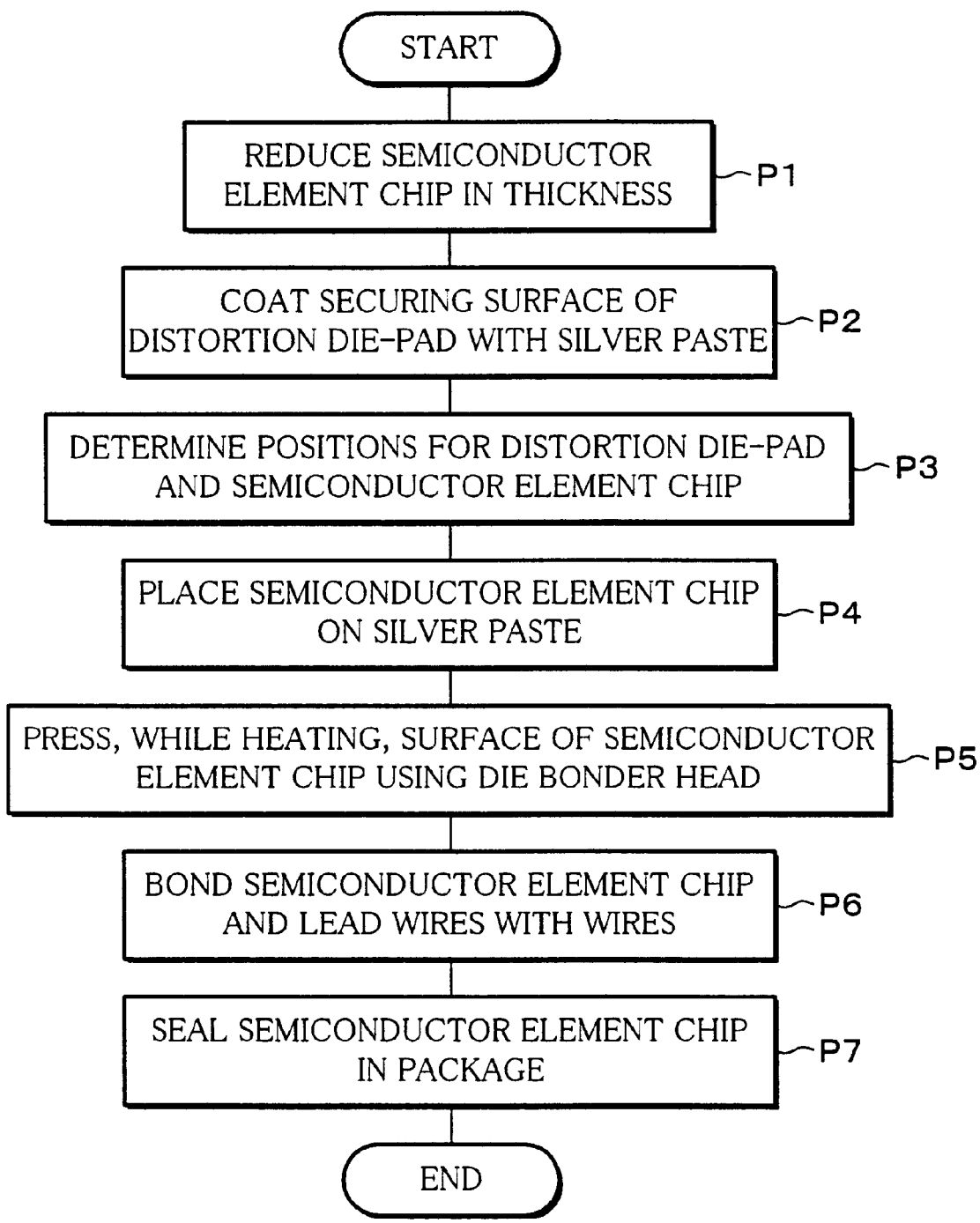
FIG. 10 is a step chart shown an example of a manufacturing process of the semiconductor devices shown in FIG. 1 and FIG. 9.

Now, referring to a step chart constituting FIG. 10, the following will discuss a method of manufacturing the semiconductor device 1 (the same process is applicable to manufacture of the semiconductor device 1a).

First, in step 1 (or P1; hereinafter, a step will be referred to as "P" where necessary), the transistor section 21 of the chip 2 is reduced in thickness from its original 200 µm or above to approximately 30 µm to 50 µm. The thickness can be reduced by a technique similar to normal abrasion including physical grinding and wet etching. The thinned transistor section 21 of the chip 2 remains in a flat state without a stress and readily warps with a stress. It is confirmed through experiment that the reduction in thickness does not affect the device.

Subsequently, in P2, a silver paste 4 is applied to form a layer on the securing surface 32 of the distortion die-pad 3 provided with the distortion part 31. In P3, positions are determined for the distortion die-pad 3 and the chip 2 so that the distortion part 31 of the distortion die-pad 3 oppositely faces the transistor section 21 of the thinned chip 2. In P4, the chip 2 is placed on the layer constituted by the silver paste 4.

Figure 11:
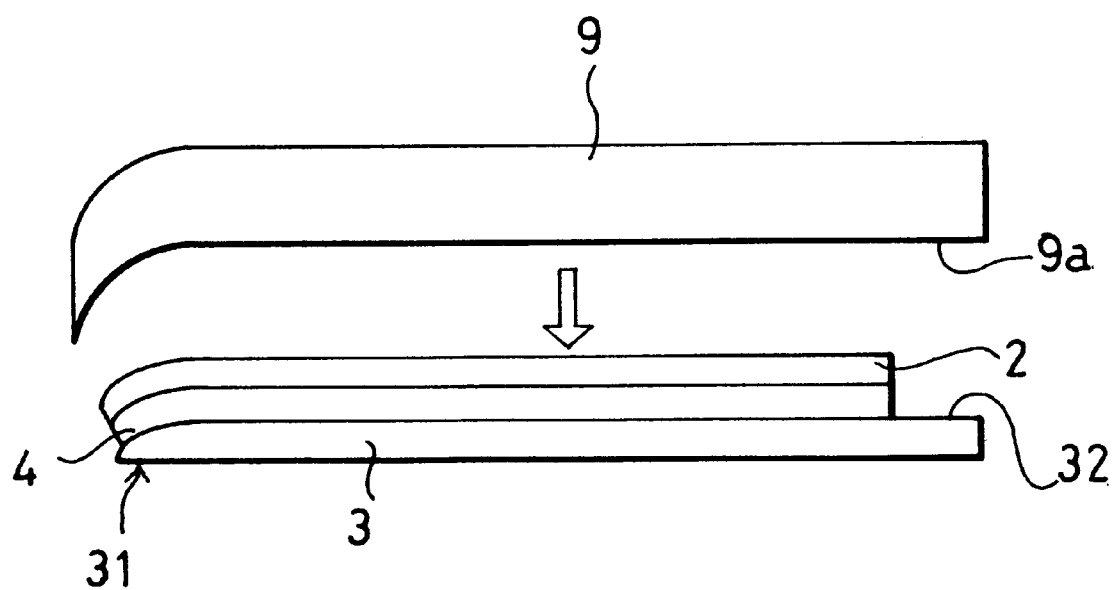
FIG. 11 is an explanatory drawing showing an example of the step 5 of pressing the surface of a chip as part of the manufacturing process of the semiconductor device shown in FIG. 10.

Subsequently, in P5, the surface of the chip 2 placed on the distortion die-pad 3 is pressed using a die bonder head 9, having an opposing surface 9a of a shape similar to that of the securing surface 32 of the distortion die-pad 3 (i.e., having a surface warped correspondingly to the distortion part 31), as shown in FIG. 11. Simultaneously with the pressing, the chip 2 is heated to 160° C. to 170° C. by means of the die bonder head 9. Accordingly, the die bonder head 9 includes heating means. Thus, the layer constituted by the silver paste 4, as a result of the pressing, secures the chip 2 onto the securing surface 32 of the distortion die-pad 3. The heating means provided in the die bonder head 9 is not limited in any particular manner.

Since the die bonder head 9 has the opposing surface 9a of a shape corresponding to that of the securing surface 32, the die bonder head 9 can gently warp the transistor section 21, and press and thereby secure the chip 2 onto the securing surface 32 of the distortion die-pad 3, without placing too great a load to the thinned chip 2 when the die bonder head 9 presses the surface of the chip 2.

Consequently, the use of the die bonder head 9 enables a relatively mechanically weak chip compared with normal chips, such as the entirely thinned chip 2, to be reliably warped and secured, and also enables an only partially thinned chip, such as the chip 2a, to be warped without damaging the thinned part.

Subsequently, in P6, the pad 5 of the chip 2 and an end of the lead wire 7 are coupled by the gold wire bonds 6, suitably by a conventional technique. In the final step (P7), a predetermined mould is used to fabricate a package 8 from an epoxy resin so as to seal the chip 2 (as well as the distortion die-pad 3). The end of the lead wire 7 that is not connected by the gold wire bond 6 sticks out of the package 8. This completes the manufacture of the semiconductor device 1 in accordance with the present invention.

As in the foregoing, the semiconductor device in accordance with the present invention is arranged so that a semiconductor element chip sealed in the semiconductor device is in a predetermined distorted state. In other words, the semiconductor device operates normally as long as the thinned part is retained in the warped state, and is prevented from operating normally if the thinned part changes into a flat state. Therefore, if the semiconductor element chip is separated from the semiconductor device and is no longer in the distorted state, the semiconductor element chip fails to operate normally, rendering it practically impossible to perform property, circuit, and other analysis on it.

Further, in the semiconductor element chip of the present embodiment, only the transistor section is warped, while the other part is in a flat state, creating a co-existence of a distorted part and a non-distorted part in the same chip. In other words, only necessary part of the semiconductor element chip is distorted, and therefore, the load placed on the semiconductor element chip is minimized.

[Embodiment 2]

Figure 12:
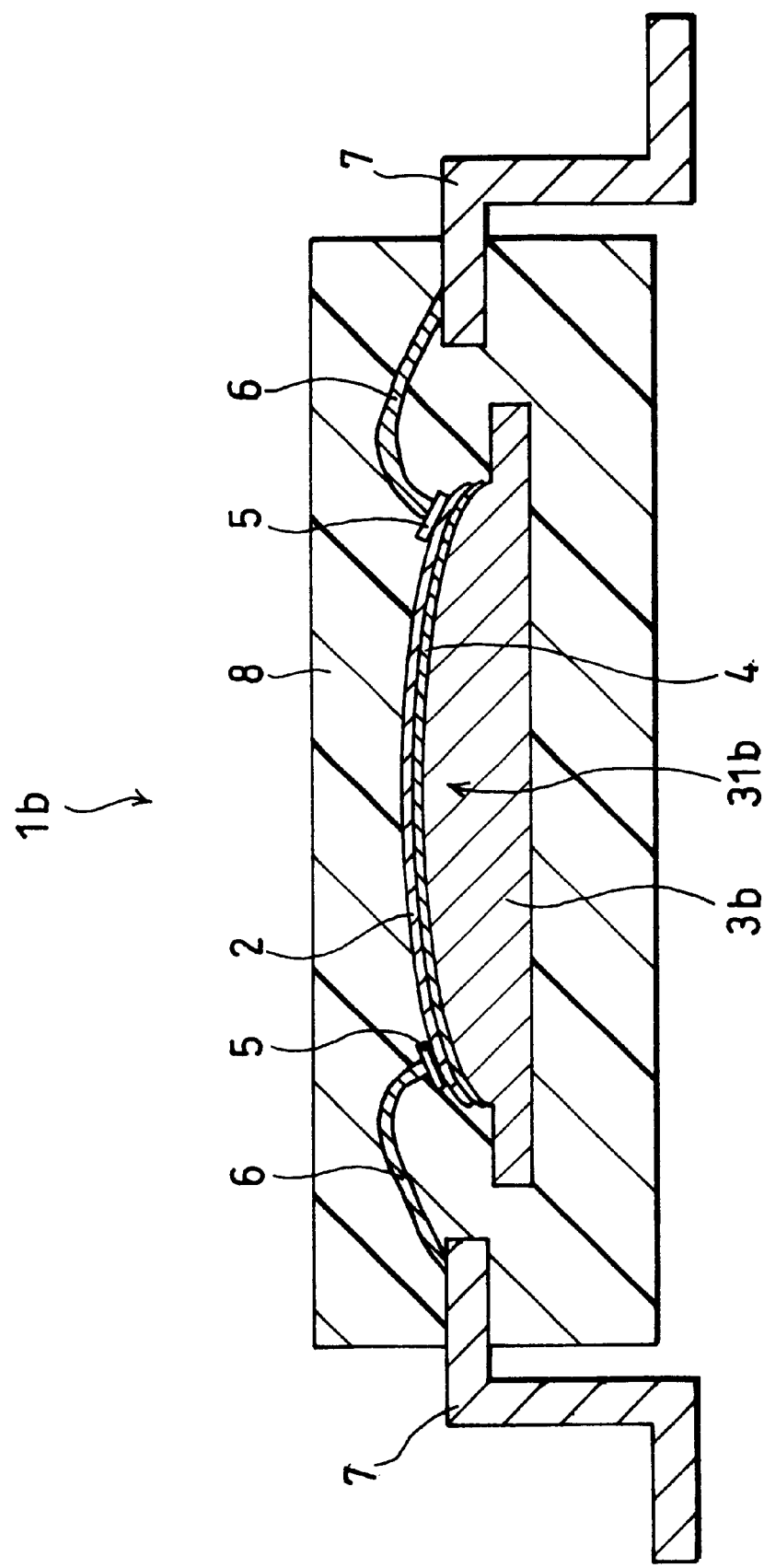
FIG. 12 is a schematic cross-sectional view showing another arrangement of the semiconductor device shown in FIG. 1.
Figure 13:
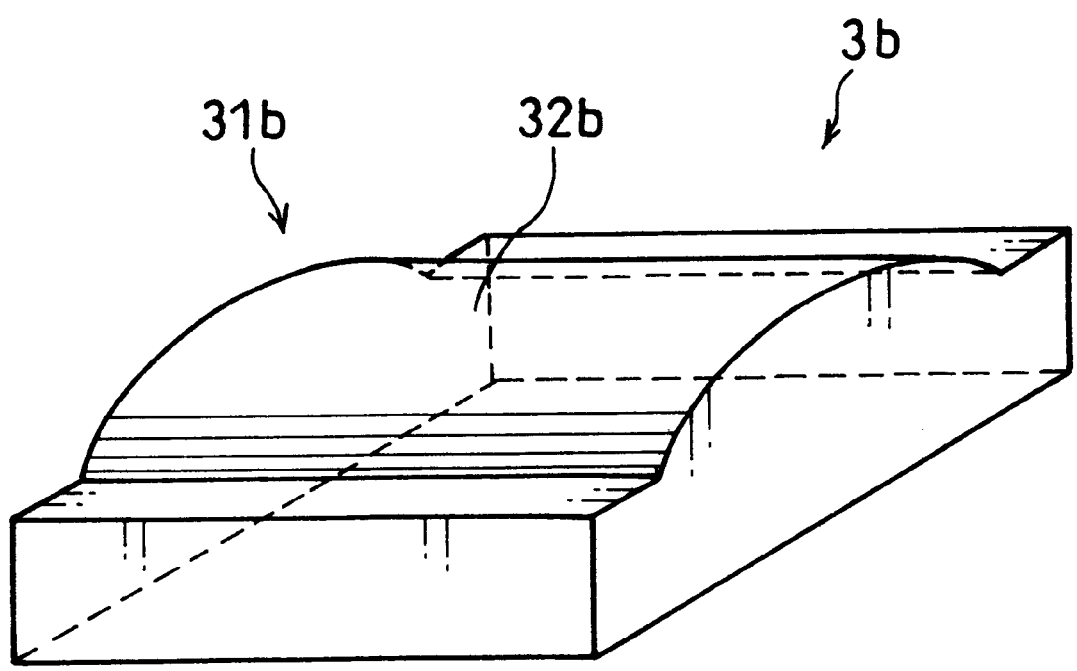
FIG. 13 is a schematic perspective view showing an example of the shape of a distort die-pad used in the semiconductor device shown in FIG. 12.

Referring to FIG. 12 to FIG. 14, the following description will discuss another embodiment in accordance with the present invention, but dose not constitute a limitation to the scope of the present invention in any manner. Here, for convenience, members of the present embodiment that have the same arrangement and function as members of the first embodiment, and that are mentioned in the first embodiment are indicated by the same reference numerals and a thorough description thereof is omitted here.

In the first embodiment, a part of the chip 2 or chip 2a is warped, and the distortion sensor 25 is provided so as to determine whether that part is released from the warped state. By contrast, in the present embodiment, the chip 2 is designed so as to operate normally when in the predetermined distorted state and not to operate normally when the chip 2 is released from the distorted state and changes into a flat state. This eliminates the need to provide the distortion sensor 25.

As shown in FIG. 12, a semiconductor device 1b of the present embodiment includes the same type of chip as the chip 2 of the first embodiment of which the entirety is reduced in thickness. A distortion die-pad 3b on which the chip 2 is secured is warped so as to form a convex surface out of the substantially entire securing surface 32b, for example, as shown in FIG. 13. Accordingly, as the chip 2 is pressed and secured onto the securing surface 32b of the distortion die-pad 3b using the silver paste 4, the entirety of the chip 2 is warped in a convex shape.

Specifically, the distortion part 31b of the distortion die-pad 3b has a convex surface covering the substantially entire securing surface 32b as shown in FIG. 13. In other words, A warping surface is formed on the securing surface 32b so that the distortion die-pad 3b is the thickest in the centre and thinnest at the edges. Alternatively, the distortion part 31b may have a concave surface covering the substantially entire securing surface 32b (not shown).

As in the foregoing, as to the distortion die-pad 3b of the present embodiment, the distortion part 31b is in the mid-part of the distortion die-pad 3b and extends so as to cover the substantially entire securing surface 32b. Therefore, as shown in FIG. 12, the substantially entire chip 2 is warped in a convex shape, and secured on the distortion die-pad 3b. The warping surface may substantially resemble that of a column, and alternatively, may be a gently curved surface, not necessarily a complete column surface.

In such an event, the LSI circuit 26 operates normally when the whole chip 2 is in a warped state. In other words, the chip 2 is designed so as to operate normally with the electrical properties of the transistor 24 in a warped state, and not to operate normally with the electrical properties of the transistor 24 when released from the distorted state and placed into a flat state.

Accordingly, if the chip 2 is separated form the distortion die-pad 3b and laid alone, the chip 2 is flat on the whole as shown in FIG. 14. As a result, the chip 2 does not operate normally, i.e., operates differently from the normal operation of the warped chip. Consequently, the chip 2 separated from the semiconductor device 1b can be protected from circuit and property analysis.

However, in the semiconductor device 1b of the present embodiment, preferably, detection means like the distortion sensor 25 is provided similarly to the foregoing if the chip 2 should be completely prohibited from operating when released from the warped state. The design of the chip 2 that operates normally only when it is warped is not limited in any particular manner: for example, the chip 2 may include gate means, interposed between circuit blocks in the chip 2, which passes a signal when the chip 2 is warped and blocks the passage of a signal when the chip 2 is in a flat state.

In the present embodiment, the substantially entire chip 2 is warped; alternatively, only a part of the chip 2 may be warped similarly to the first embodiment. The semiconductor device 1b of the present embodiment needs to be designed at least so that the chip 2 operates normally when in the distorted state and does not operate normally when the chip 2 changes into a flat state.

[Embodiment 3]

Figure 15:
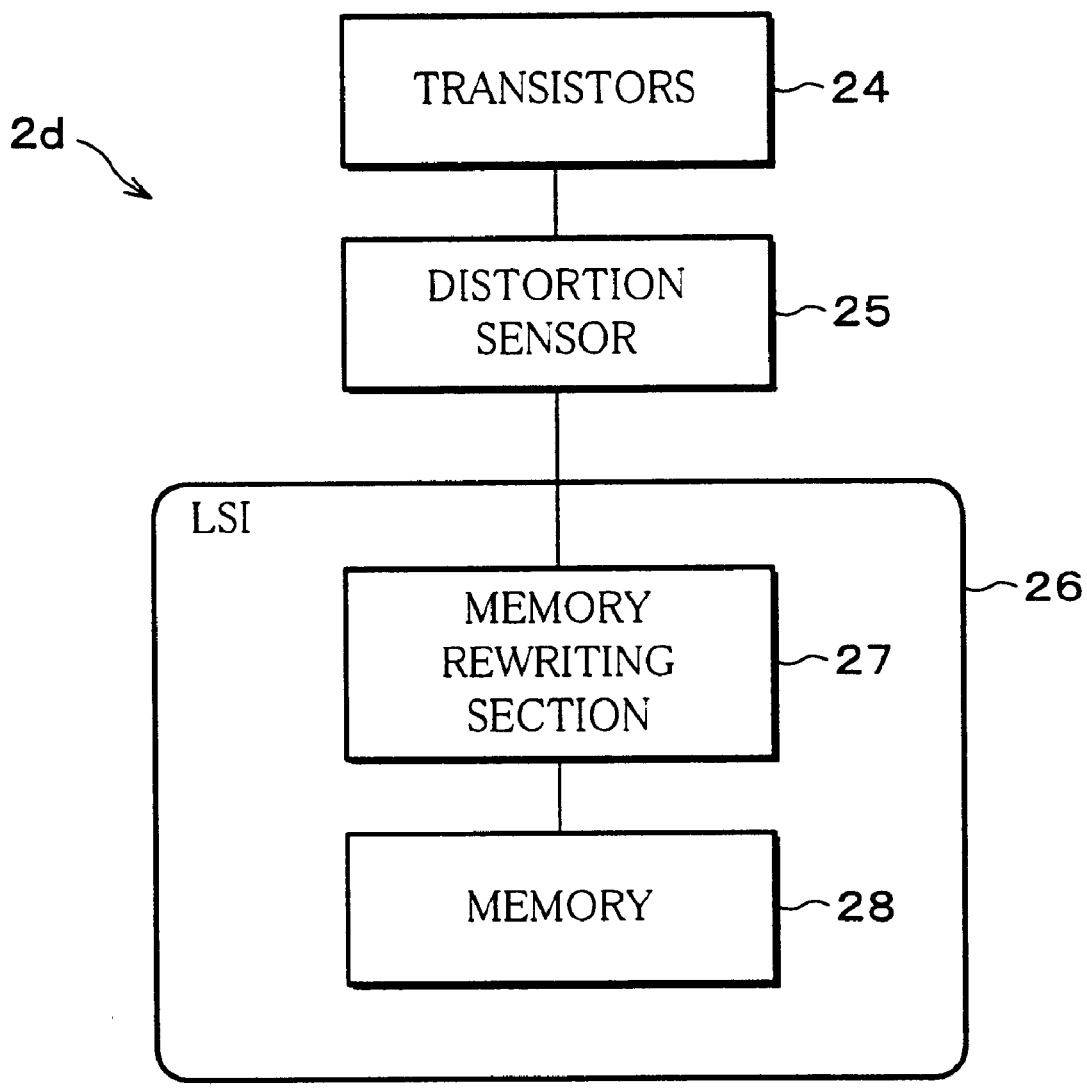
FIG. 15 is a block diagram showing a further arrangement of the semiconductor element chip shown in FIG. 2.
Figure 16:
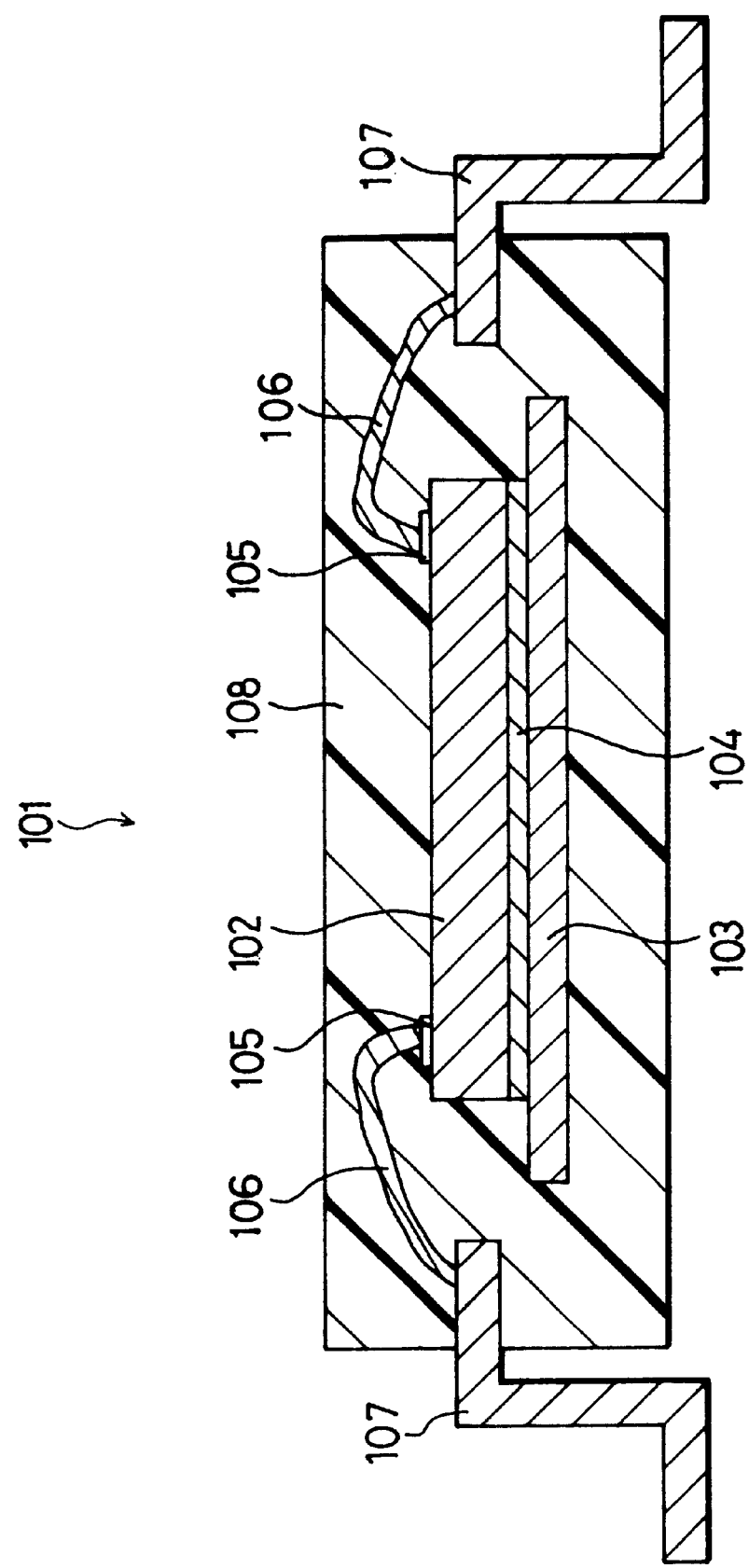
FIG. 16 is a schematic cross-sectional view showing an arrangement of a conventional semiconductor device.

Referring to FIG. 7 and FIG. 15, the following description will discuss another embodiment in accordance with the present invention, but dose not constitute a limitation to the scope of the present invention in any manner. Here, for convenience, members of the present embodiment that have the same arrangement and function as members of the first or second embodiment, and that are mentioned in the first or second embodiment are indicated by the same reference numerals and a thorough description thereof is omitted here.

In the first and second embodiments, the LSI circuit 26 disposed in the chip 2 is not allowed to operate normally if the chip 2 is separated from the semiconductor device 1 or the semiconductor device 1b. By contrast, in the present embodiment, the LSI circuit 26 is provided with storage means (storage device) like rewritable memory and, once the chip 2 is separated from the semiconductor device 1, the data stored in the memory becomes unreadable.

The data stored in the memory is made unreadable in any manner, provided that data reading can be prevented when the chip 2 is released from the predetermined distorted state and changes into a flat state. In the present embodiment, a memory rewriting section (memory rewriting means) is incorporated and will be explained as data reading prevention means.

Specifically, the chip 2d of the present embodiment includes a transistor 24, a distortion sensor 25, and an LSI circuit 26 as shown in the block diagram constituting FIG. 15. The LSI circuit 26 includes a memory (storage means) 28 and a memory rewriting section (data reading prevention means) 27. The memory 28 is rewritable. A predetermined set of data is stored in the memory 28 when secured on the distortion die-pad 3. The memory rewriting section 27 is disposed so as to connect the memory 28 to the distortion sensor 25.

Similarly to the first embodiment, when a drive voltage is applied to the transistor 24, a property voltage V1 is produced in relation with the property current Id produced by the resistor R and the transistor 24 as shown in FIG. 7, and coupled to one of the input terminals of the comparator Cp. The comparator Cp compares the property voltage V1 with the predetermined voltage V2 coupled to the other input terminal; if the predetermined voltage V2 is greater than the property voltage V1 (V2>V1), the comparator Cp transmits a high signal through its output terminal to the LSI circuit 26; if the predetermined voltage V2 is smaller than the property voltage V1 (V2<V1), the comparator Cp transmits a low signal through its output terminal to the LSI circuit 26.

As previously mentioned, if the transistor 24 is constituted by NMOS transistors and warped downward, the comparator Cp determines that the chip 2d is in the predetermined distorted state and also that the transistor 24 has normal electrical properties provided that the predetermined voltage V2 is smaller than the property voltage V1 (V2<V1). Therefore, if the output signal from the distortion sensor 25 is a low signal, the memory rewriting section 27 is not activated.

By contrast, if the output signal from the distortion sensor 25 is a high signal, the comparator Cp determines that the chip 2d is released from the distorted state and also that the transistor 24 does not have normal electrical properties; therefore, the high signal eventually causes the memory rewriting section 27 to be activated and rewrites the data stored in the memory 28. To sum it up, a normal set of data is stored in the memory 28 if the chip 2d is secured to the semiconductor device 1 in the predetermined distorted state, whereas the data in the memory 28 is rewritten by the memory rewriting section 27 if the chip 2d is separated from the semiconductor device 1 and laid alone so as to allow a probe to be performed for circuit analysis and the like. This effectively prevents analysis of normal data in the memory 28.

Although the memory rewriting section 27 for rewriting the memory 28 is taken as an example of data reading prevention means in the present embodiment, alternatively, a deletion circuit may be used as data reading prevention means provided that the memory 28 is a flash memory.

In this manner, the semiconductor device of the present embodiment includes a semiconductor element chip which in turn includes data reading prevention means.

Therefore, when the semiconductor device is separated from the semiconductor element chip, the semiconductor element chip is protected from analysis, and, on top of that, the data in the memory is protected from reading. This further ensures that the semiconductor element chip is protected from analysis.

As in the foregoing, the semiconductor device in accordance with the present invention includes a semiconductor element distorted in a predetermined shape and sealed in a package. If the semiconductor element is separated from the package, the semiconductor element is released from the distorted state and changes into a flat state; therefore, the circuit in the semiconductor element fails to function normally or completely fails to operate at all. This ensures that the semiconductor element is protected from circuit analysis and also that secret information of the semiconductor element is protected.

Note in the present invention that if a drive voltage is supplied to the distorted transistor section with the semiconductor element chip being packaged, the distortion sensor in the sensor section determines that the channel current has a normal value and produces a signal that causes the LSI circuit in the LSI section to operate. Therefore, if the semiconductor element chip is separated and laid alone to allow a probe to be performed for circuit analysis, the drive voltage applied to the transistor section that is now flat produces a channel current that differs from the channel current in distorted state, causing the distortion sensor to prevent the LSI section from operating normally.

A specific example is discussed in the previous embodiments, where the transistor 24 is constituted by NMOS transistors and the chip 2 is warped downward in parallel or perpendicular to the flow of the channel current. In such an event, the transistor 24 to which a drive voltage is applied produces a smaller property current Id when the chip 2 is separated and laid alone, thereby released from the downward warped state and changes into a flat state than when the chip 2 is packaged. The distortion sensor 25 thus detects the decreased property current Id and prevents the LSI circuit 26 from operating normally.

However, if the transistor 24 is constituted by NMOS transistors, the property current Id changes differently when the chip 2 is warped upward and when the chip 2 is warped downward. Specifically, if the transistor 24 is constituted by NMOS transistors and the chip 2 is warped upward, the property current Id is likely to increase with the change of the chip 2 from the distorted state to a flat state, and the absolute value of that change (percentage points) differs from that of the decrease with the chip 2 warped downward.

Therefore, the arrangement of the distortion sensor 25 discussed in the first embodiment is an example of NMOS transistors warped downward, and dose not constitute a limitation to the scope of the present invention in any manner. Further, the electrical property produced in the distorted part when the chip 2 is in the predetermined distorted state is not limited to the property current Id; alternatively, any electrical property whose change is detectable may be used.

A semiconductor device in accordance with the present invention may be such that the semiconductor element is secured on a die-pad in the package, and a distortion die-pad having a shape capable of holding the secured semiconductor element in the predetermined distorted state is used as the die-pad.

With the arrangement, the die-pad is a distortion die-pad having a shape capable of holding the secured semiconductor element in the predetermined distorted state; this ensures that the semiconductor element is held in the distorted state in the package.

A semiconductor device in accordance with the present invention may be such that the semiconductor element is secured on the die-pad with at least a part of the semiconductor element being thinned so as to allow distortion.

With the arrangement, at least a part of the semiconductor element is thinned so as to allow distortion of that part; therefore, the semiconductor element can be readily distorted on the distortion die-pad.

A semiconductor device in accordance with the present invention may be such that the semiconductor element includes a transistor section where transistors are provided in a high density, and the predetermined distorted state of the semiconductor element is a state where at least the transistor section is warped downward or upward (the surface of the transistor section forms a convex or concave shape).

With the arrangement, in the semiconductor element, at least the transistor section where transistors are provided is warped. The warping is relatively easy to achieve compared with other types of distortion, and is surely retained while the semiconductor element is being secured on the distortion die-pad. In addition, the warping does not negatively affect the semiconductor element. Further, by warping the transistor section, the electrical properties of the transistors are readily changed. Therefore, once the semiconductor element is separated from the semiconductor device, the transistors no longer show such electrical properties that allow normal operation. This ensures that the semiconductor element is protected from circuit analysis.

Further, if only the transistor section is in the warped state with the rest being in a flat state, only the smallest possible part of the semiconductor element is distorted to fulfill requirements, the semiconductor element receives only a minimum load.

A semiconductor device in accordance with the present invention may be such that the semiconductor element includes detection means for detecting a change in an electrical property produced in a distorted part only when the semiconductor element is in the predetermined distorted state and thereby controlling operation of the integrated circuit.

With the arrangement, the detection means detects a change in a property of the transistor when the semiconductor element in the predetermined distorted state is released from the distorted state; this ensures that the distorted state under which the semiconductor element should operate normally is distinguished from the distortion-released state under which the semiconductor element should not operate normally.

A semiconductor device in accordance with the present invention may be such that the semiconductor element is designed so as to operate normally only when the semiconductor element is in the predetermined distorted state.

With the arrangement, a circuit is designed in advance so that the semiconductor element operates normally when the semiconductor element is in the predetermined distorted state, and fails to do so when the semiconductor element is released from the distorted state and changes into a flat state; therefore, the distorted state under which the semiconductor element should operate normally is distinguished from the distortion-released state under which the semiconductor element should not operate normally only by means of the distortion of the semiconductor element. This eliminates the need for provision of the detection means to the semiconductor element, and enables the circuit arrangement of the semiconductor element to be simplified.

A semiconductor device in accordance with the present invention may be such that the semiconductor element includes:

rewritable storage means; and data reading prevention means, activated as controlled by the detection means, for preventing reading of data stored in the storage means.

With the arrangement, the semiconductor element includes data reading prevention means; therefore, even if the semiconductor element is separated from the semiconductor device, the semiconductor element is protected from analysis, and the reading of data in the storage means is prevented. This further ensures that the semiconductor element is protected from circuit analysis.

A method of manufacturing a semiconductor device in accordance with the present invention is such that it includes the step of securing and thereafter sealing the semiconductor element that operates normally only in a predetermined distorted state in the package in the distorted state. This enables manufacture of a semiconductor device that ensures that the semiconductor element is protected from circuit analysis.

The foregoing method of manufacturing is preferably such that the semiconductor element is secured onto a die-pad, a distortion die-pad having a shape capable of holding the secured semiconductor element in the predetermined distorted state is used as the die-pad, and a surface of the semiconductor element is pressed by a head having a shape corresponding to the distortion die-pad when the semiconductor element is secured onto the distortion die-pad.

According to the method, a head having an opposing surface of a shape corresponding to the distortion die-pad is used so as to secure the semiconductor element onto the distortion die-pad; therefore, the semiconductor element receives only a moderate load when pressed at the surface. This allows the semiconductor element to be secured onto the distortion die-pad, while ensuring that the semiconductor element is distorted. Therefore, even if, for example, the semiconductor element is thinned and thereby has a relatively poor mechanical strength in comparison with a typical semiconductor element, the semiconductor element still can be secured onto the distortion die-pad, while it is ensured that the semiconductor element is distorted.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device comprising:
a semiconductor element with an integrated circuit; and a package for sealing the semiconductor element therein, so as to be connected to an external circuit for use,
the semiconductor element is secured in the package in a distorted state, the semiconductor element warps or otherwise deforms under stress when in a package and recovers when taken out of the package due to lack of stress
the semiconductor element operates normally only in the distorted state,
wherein the semiconductor element includes detection means for detecting an electrical property produced in a distorted part only when the semiconductor element is in the distorted state and thereby controlling operation of the integrated circuit.

2. The semiconductor device as defined in claim 1, wherein
the semiconductor element is secured on a die-pad in the package, and
a distortion die-pad having a shape capable of holding the secured semiconductor element in the distorted state is used as the die-pad.

3. The semiconductor device as defined in claim 2, wherein
the semiconductor element is secured on the die-pad with at least a part of the semiconductor element being thinned so as to allow distortion.

4. The semiconductor device as defined in claim 3, wherein
the thinned part has a thickness of 50 $\mu$m or below.

5. The semiconductor device as defined in claim 1, wherein
the semiconductor element includes a transistor section where transistors are provided in a high density, and
the distorted state of the semiconductor element is a state where at least the transistor section is warped downward or upward.

6. The semiconductor device as defined in claim 1, wherein
the semiconductor element includes:
storage means for storing data; and
data reading prevention means, activated as controlled by the detection means, for preventing reading of data stored in the storage means.

7. The semiconductor device as defined in claim 1, wherein
the semiconductor element including:
rewritable storage means for storing data; and
memory rewriting means for rewriting the data stored in the storage means, wherein
the storage means stores a predetermined set of data if the semiconductor element is in the distorted state, and the memory rewriting means, activated as controlled by the detection means, for rewriting the data stored in the storage means.

8. The semiconductor device as defined in claim 1, wherein
the semiconductor element is designed so as to operate normally only when the semiconductor element is in the distorted state.

9. The semiconductor device as defined in claim 9, wherein
the semiconductor element includes a transistor section where transistors are provided in a high density, and
a thinned part of the semiconductor element includes at least the transistor section.

10. The semiconductor device as defined in claim 9, wherein
the distorted state of the semiconductor element is a state where at least the transistor section is warped downward or upward.

11. The semiconductor device as defined in claim 10, wherein
the semiconductor element includes detection means for detecting a change in an electric current of the transistors that occurs when the transistor section warps and thereby controlling operation of the integrated circuit.

12. The semiconductor device as defined in claim 11, wherein the detection means is an OP-amplifier including a resistor and a comparator.

13. A semiconductor device, comprising:

a semiconductor element including an integrated circuit and transistors, at least a part of the semiconductor where the transistors are provided are provided in a high density element being thinned so as to be warped;

a distortion die-pad having a,securing surface having a shape capable of holding the thinned part of the semiconductor element in a predetermined warped state;

a package for sealing inside the distortion die-pad having the securing surface on which the semiconductor element is secured; and lead wires each having an end connected to the semiconductor element and the other end sticking out of the package, the semiconductor element operates normally as long as the thinned part is held in the warped state, and is prevented from operating normally if the thinned part changes into a flat state, and once the semiconductor element is separated from the distortion die-pad, the thinned part is released from the warped state and changes into a flat state because of elasticity of the semiconductor element; wherein the semiconductor element further includes detection means for detecting a change in an electrical current of the, transistors that occurs when the thinned part is warped and thereby controlling operation of the integrated circuit, and the detection means prevents the semiconductor element from operating normally either by terminating transmission of a signal causing the integrated circuit to operate normally or by transmitting a signal preventing operation of the integrated circuit.

14. A method of manufacturing a semiconductor device, wherein in a step of sealing a semiconductor element with an integrated circuit in a package, a semiconductor element that-operates normally only in a distorted state is secured and thereafter sealed in the package in the distorted state and detecting a distorted state of the semiconductor element with a means for detecting in the semiconductor element.

15. The method of manufacturing a semiconductor device as defined in claim 14, wherein the semiconductor element is secured onto a die-pad, a distortion die-pad having a shape capable of holding the secured semiconductor element in the distorted state is used as the die-pad, and a surface of the semiconductor element is pressed by a head having a shape corresponding to the distortion die-pad when the semiconductor element is secured onto the distortion die-pad.

16. The method of manufacturing a semiconductor device as defined in claim 14, wherein a silver paste is used to secure the semiconductor element onto the distortion die-pad, and the head includes heating means for heating the semiconductor element simultaneously as the head presses a surface of the semiconductor element.

* * * * *

UNITED STATES PATENT AND TRADEMARK OFFICE
CERTIFICATE OF CORRECTION

PATENT NO.    : 6,472,730 B1                                         Page 1 of 1
DATED         : October 29, 2002
INVENTOR(S)   : Eiji Yanagawa et al.

It is certified that error appears in the above-identified patent and that said Letters Patent is hereby corrected as shown below:

Title page
Item [56], FOREIGN PATENT DOCUMENTS, please add the following lines:
--      JP 9-51058     2/1997
        JP 6415957     1/1989
        JP 593659      4/1993 --

Column 16,
Line 53, cancel "claim 9" and insert -- claim 8 -- in its place

Signed and Sealed this

Fifteenth Day of July, 2003

JAMES E. ROGAN
*Director of the United States Patent and Trademark Office*